United States Patent
Lee

(10) Patent No.: US 8,587,023 B2
(45) Date of Patent: Nov. 19, 2013

(54) GUARD RINGS WITH LOCAL COUPLING CAPACITANCE

(75) Inventor: Cheng Hung Lee, Hukou (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 662 days.

(21) Appl. No.: 11/137,241

(22) Filed: May 25, 2005

(65) Prior Publication Data

US 2006/0267132 A1 Nov. 30, 2006

(51) Int. Cl.
*H01L 29/74* (2006.01)

(52) U.S. Cl.
USPC ........... 257/127; 257/170; 257/171; 257/409; 438/140; 438/454

(58) Field of Classification Search
USPC ............ 257/127, 409, 452, 490, 494–495, 257/E29.012, E29.013, 170–171; 438/140
See application file for complete search history.

(56) References Cited

U.S. PATENT DOCUMENTS

| 5,375,083 A * | 12/1994 | Yamaguchi | 365/185.27 |
| 5,801,411 A * | 9/1998 | Klughart | 257/296 |
| 5,946,259 A * | 8/1999 | Manning et al. | 365/226 |
| 6,303,957 B1 * | 10/2001 | Ohwa | 257/307 |
| 2005/0189602 A1* | 9/2005 | Yamamoto et al. | 257/494 |

FOREIGN PATENT DOCUMENTS

JP 2000049286 A * 2/2000

* cited by examiner

*Primary Examiner* — Ajay K Arora
(74) *Attorney, Agent, or Firm* — K&L Gates LLP

(57) ABSTRACT

A guard ring system is disclosed for protecting an integrated circuit comprising. It has a first guard ring area formed by a well in the substrate, a capacitor area formed within the first guard ring area which further includes two well contacts formed into the well and biased by a first supply voltage, and a dielectric layer placed between the two contacts on the well with its first side in contact with the well. A second supply voltage complementary to the first supply voltage is applied to a second side of the dielectric layer so that a voltage difference across the dielectric layer provides a local capacitance embedded therein.

11 Claims, 5 Drawing Sheets

GUARD RINGS WITH LOCAL COUPLING CAPACITANCE

BACKGROUND

The present invention relates semiconductor devices, and more particularly to a guard ring structure providing added protection against diffused ions and noises.

A guard ring is a protective structure encircling part of or an entire active region of a semiconductor device. By biasing the guard rings to a high or a low potential, guard rings provide a barrier to ionic contamination or noise that can penetrate the exposed edges of diced chip during manufacture. Additionally, a guard ring can act as a physical wall to provide mechanical stability to a semiconductor device.

Traditional integrated circuits (ICs) contain multiple circuit sections, each section with different characteristics and functional tasks. Certain sections must be isolated from other sections. Historically, a single chip device contains a single guard ring protecting all active circuit sections regardless of their differing characteristics. Newer techniques use multiple guard rings, especially when the IC contains a mix of digital and analog circuits.

As an example, isolation of these sections is required to reduce noise propagation. In larger ICs, noise travels easily and causes many unwanted and unmanageable noise coupling situations. As another example, a guard ring is used to isolate circuits with different voltage domains. The different voltage domains required by today's high-power transistors with low-voltage control is a cause for voltage-related latch-ups. A latch-up is a condition in which a circuit draws uncontrolled amounts of current, thereby forcing voltages to "latch-up" to an undesirable, uncontrollable level that violates the operating conditions of the circuit.

During the operation of an active device, a flow of electrons and holes is induced by the changes in potential in the components inside the active device. Some electrons and holes stray from the current path and propagate to adjacent active devices, causing faulty activation, performance degradation, or a latch-up of those devices. In order to prevent electrons and holes from propagating to other devices guard rings are used. Guard rings act as well and substrate contact and are biased to collect lose electrons and holes. To reduce the movement of minority carriers, guard rings are further biased for improved performance.

Traditional methods of wiring a guard ring includes connecting a high potential (Vdd) to the N+ doped region within the N well, and a ground potential (Vss) to the P+ doped region within the P substrate. However, such methods are insufficient to deal with the high local dynamic current of the active devices which induces a net voltage drop in the device. Net voltage drop not only results in degraded circuit performance, but also induce circuit failure and/or timing mismatch. As devices become smaller and require less power, this problem worsens. At worst, a net voltage drop may be large enough to render a device inoperable.

Desirable in the art of guard ring designs are additional designs that provide added protection against diffused ions and noise that typically causes latch-up.

SUMMARY

In view of the foregoing, the present invention provides structures for reducing propagation of ions and noise into adjacent devices in a semiconductor complementary metal-oxide-semiconductor (CMOS) device by using a CMOS capacitor configuration in the guard rings of an active device.

According to one embodiment, a guard ring system has a first guard ring area formed by a well in the substrate, a capacitor area formed within the first guard ring area which further includes two well contacts formed into the well and biased by a first supply voltage, and a dielectric layer placed between the two contacts on the well with its first side in contact with the well. A second supply voltage complementary to the first supply voltage is applied to a second side of the dielectric layer so that a voltage difference across the dielectric layer provides a local capacitance embedded therein.

By using a CMOS capacitor configuration as guard rings, external noise is effectively shielded while latch-up conditions can be reduced or eliminated.

The construction and method of operation of the invention, however, together with additional objects and advantages thereof will be best understood from the following description of specific embodiments when read in connection with the accompanying drawings.

DESCRIPTION

The present disclosure provides a detailed description of a guard ring structure for providing additional protection against diffused ions and noise that typically causes latch-up.

Figure 1:
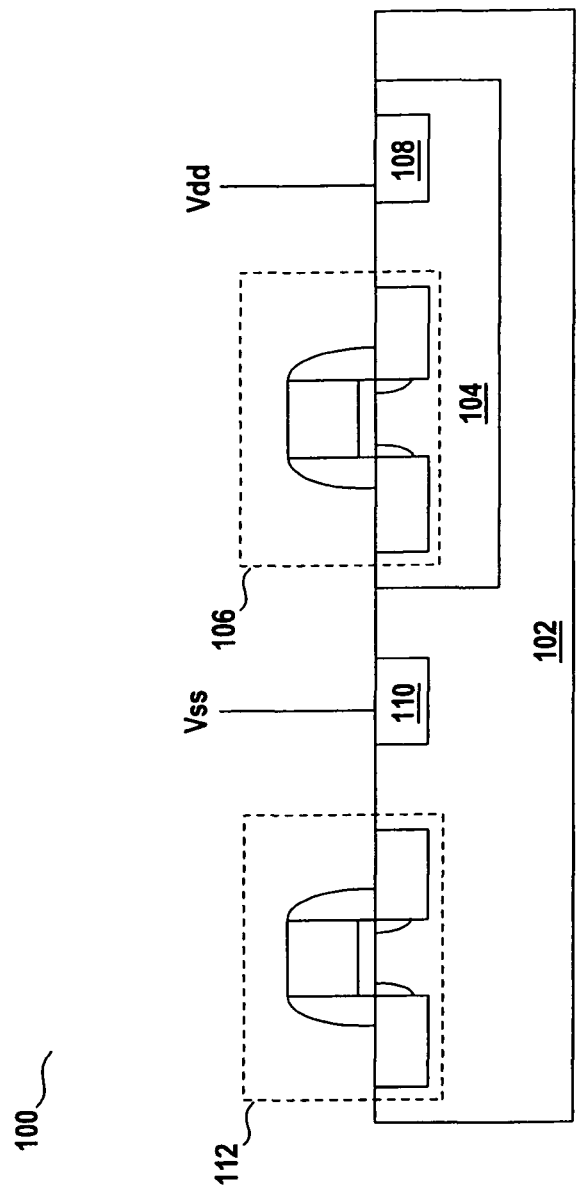
FIG. 1 presents a partial cross-sectional view of a CMOS device having two conventional guard rings.

FIG. 1 presents a partial cross-sectional view of a CMOS device 100 having two conventional guard rings. The CMOS device 100 is constructed by first forming a deeply defused N-well 104 in a P substrate 102. An active PMOS device 106 resides inside the N-well 104. The PMOS device 106 may be a single device such as a transistor, but may also be a group of several devices located in a distinctive region in the integrated circuit (IC). Also located in the N-well 104 is a guard ring 108. The guard ring 108 is constructed of an implanted N+ type material. By biasing the guard ring 108 to a higher potential, holes in the P-substrate 102 can be collected. In this case, the guard ring 108 is connected to an operating voltage of the IC, or Vdd. A guard ring 110 is also formed in the P substrate 102 and is used to collect stray electrons from a NMOS device 112. The NMOS device 112 may be a single device such as a transistor, but may also be a group of several devices located in a distinctive region in the IC. The guard ring 110 acts as a substrate contact and is used to biased the P substrate 102 to ground potential, or Vss. It is understood that a guard ring may or may not surround its adjacent active CMOS device and can be constructed as a group.

One disadvantage of the conventional design described above is that the field created by the guard rings 108 and 110 may not be strong enough to prevent noise from adjacent CMOS devices from entering into the devices 106 and 112. While multiple guard rings may be constructed to increase the field, the increased number of guard rings requires additional and expensive IC space.

Figure 2A:
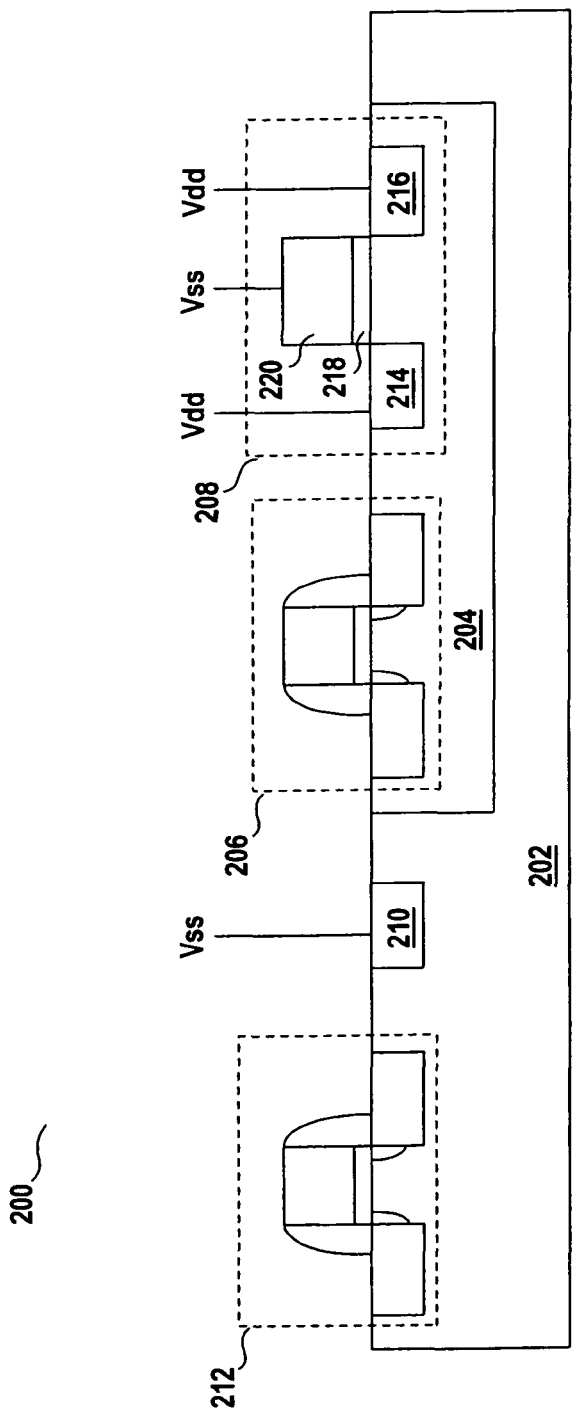
FIG. 2A presents a partial cross-sectional view of a CMOS device having a conventional guard ring and a second guard ring built in a N-well with a NMOS capacitor configuration in accordance with a first embodiment of the present invention.

FIG. 2A presents a partial cross-sectional view of a CMOS device 200 having a conventional guard ring and a second guard ring built in a N-well with a NMOS capacitor configuration in accordance with a first embodiment of the present invention. The CMOS device 200 is constructed by first forming a deeply defused N-well 204 in a P substrate 202. An active PMOS device 206 resides inside the N-well 204. Also located in the N-well 204 is a guard ring 208 embedded with a capacitor structure, which includes the N-well portion directly underneath. Another guard ring area such as an electron P+ guard ring 210 is constructed into the P substrate 202, between the device 206 and another active device 212. The P+/P− interface generates an electric field that traps most of the injected electrons into the P-substrate 202. This guard ring area 210 is place close to the first guard ring area 208 as shown.

The guard ring 208 is constructed in an NMOS configuration. Two well contacts 214 and 216 are formed by implanting N+ type material into the N-well 204. A dielectric layer such as an oxide layer 218 is grown on the N-well 204, since an oxide layer is also grown in the fabrication of the devices 206 and 212. The oxide layer is preferred to use the same material as input/output (I/O) transistors. A polycrystalline layer 220 or other conducting material is then deposited above the oxide layer 218, and aligned between the well contacts 214 and 216. The oxide layer 218 and the polycrystalline layer 220 constitute the gate of the NMOS. The well contacts 214 and 216 are biased to a potential higher than that at the P substrate 202 to reverse-bias the N+/N-well junction. Both the well contacts 214 and 216 are biased to a positive supply voltage such as Vdd to help drive the depletion region deeper into the N-well/P-substrate to enhance collection efficiency. The polycrystalline layer 220 is biased to a potential equal that of the P substrate 202, which is a grounding voltage such as Vss in this embodiment.

An advantage of this embodiment is the configuration of the guard ring 208. The bias scheme used in the guard ring 208 transform the NMOS transistor configuration into an NMOS capacitor configuration. The natural resistance created by the length of the guard ring 208 and the capacitance of the NMOS capacitor configuration of the guard ring 208 together act as a noise filter. The capacitor configuration blocks out noise created by adjacent device transients that may pull devices above supply or below ground potential. Common sources of such transients are low level electro static discharge events, momentary power interruption and signal spikes created by rapidly switching devices.

Figure 2B:
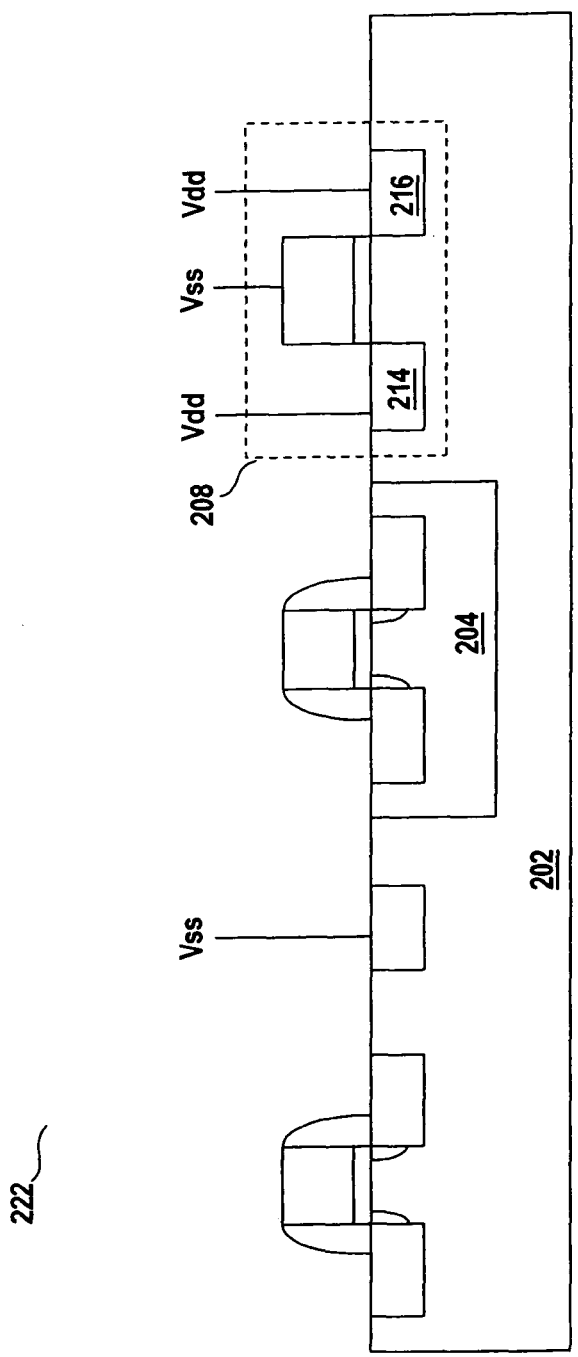
FIG. 2B presents a partial cross-sectional view of a CMOS device having a conventional guard ring and a second guard ring built outside a N-well with a NMOS capacitor configuration in accordance with a second embodiment of the present invention.

FIG. 2B presents a partial cross-sectional view of a CMOS device 222 having a conventional guard ring and a second guard ring built without a N-well with a NMOS capacitor configuration in accordance with a second embodiment of the present invention. FIG. 2B is identical to FIG. 2A except that the guard ring 208 lies just outside the N-well 204 region. The well contacts 214 and 216 have a lower hole collecting efficiency, but are virtually immune to de-biasing. Without the N-well 204, the well contacts 214 and 216, which are connected to Vdd, further help driving off the depletion region deeper into the P-substrate 202 to enhance the hole collecting efficiency.

Figure 3A:
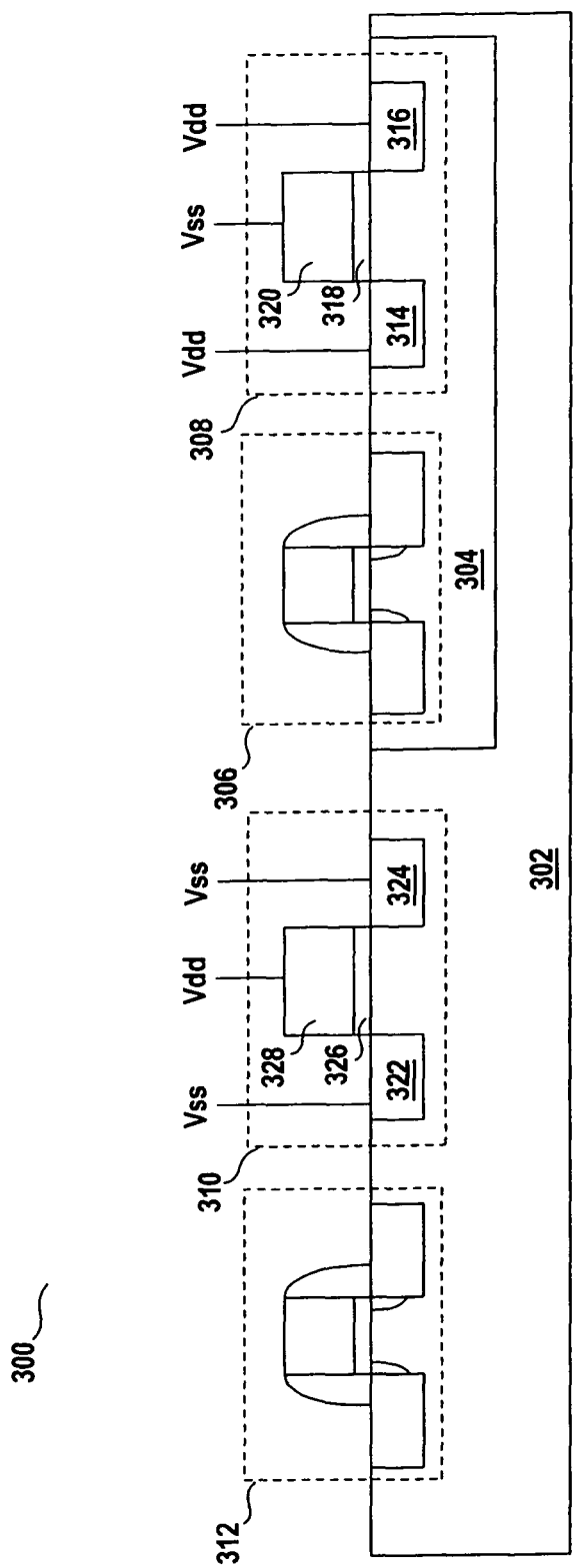
FIG. 3A presents a partial cross-sectional view of a CMOS device having a first guard ring built on a P-type semiconductor substrate with a PMOS capacitor configuration and a second guard ring in a N-well with a NMOS capacitor configuration in accordance with a third embodiment of the present invention.

FIG. 3A presents a partial cross-sectional view of a CMOS device 300 having a first guard ring built on a P-type semiconductor substrate with a PMOS capacitor configuration and a second guard ring in a N-well with a NMOS capacitor configuration in accordance with a third embodiment of the present invention. The CMOS device 300 is constructed by first forming a deeply defused N-well 304 in a P substrate 302. A first guard ring 308 resides inside the N-well 304 and just adjacent to an active PMOS device 306. The guard ring 308 is constructed in an NMOS configuration. A second guard ring 310 lies in the P substrate 302 and is used to collect free electrons from an active NMOS device 312 and the P substrate 302.

Two well contacts 314 and 316 are formed by implanting N+ type material into the N-well 304, and constitute the source and drain of the NMOS configuration. An IO oxide layer 318 is grown on the N-well 304. A polycrystalline layer 320 is then deposited above the oxide layer 318 and aligned between the well contacts 314 and 316. The oxide layer 318 and the polycrystalline layer 220 constitute the gate of the NMOS. The well contacts 314 and 316 are biased to a potential higher than that of the P substrate 302 to reverse-bias into the N+/N-well junction. Both the well contacts 314 and 316 are biased to Vdd to help drive the depletion region deeper into the N-well/P-substrate to enhance collection efficiency. The polycrystalline layer 320 is biased to a potential equal to that of the P substrate 302, which is Vss in this embodiment.

The guard ring 310 is constructed in a PMOS configuration. Two well contacts 322 and 324 are formed by implanting P+ type material into the P substrate 302, and constitute the source and drain of the PMOS configuration. An IO oxide layer 326 is grown on the surface of the P substrate 302. A polycrystalline layer 328 is then deposited above the oxide layer 326 and aligned between the well contacts 322 and 324. The oxide layer 326 and the polycrystalline layer 328 constitute the gate of the PMOS configuration. The P substrate 302 is biased to Vss or ground through the well contacts 322 and 324 to forward-bias into the P+/P substrate junction. Both the well contacts 322 and 324 are biased to a ground supply Vss to help drive the depletion region deeper into the P substrate 302 to enhance electron collection efficiency. The polycrystalline layer 328 is biased to a potential higher than that of the P substrate 302, which is Vdd in this embodiment.

An advantage of this embodiment is the configuration of the guard ring 308 in a NMOS configuration and the guard ring 310 in a PMOS configuration. Negative gate bias on the guard ring 308 and positive gate bias on the guard ring 310 create a local energy storage in the device 300. The dynamic current drawn from Vdd and Vss leads to a voltage drop in Vdd, and ground bounce on the Vss can benefit from the noise rejection of the local MOS capacitance provided by the guard rings 308 and 310.

Figure 3B:
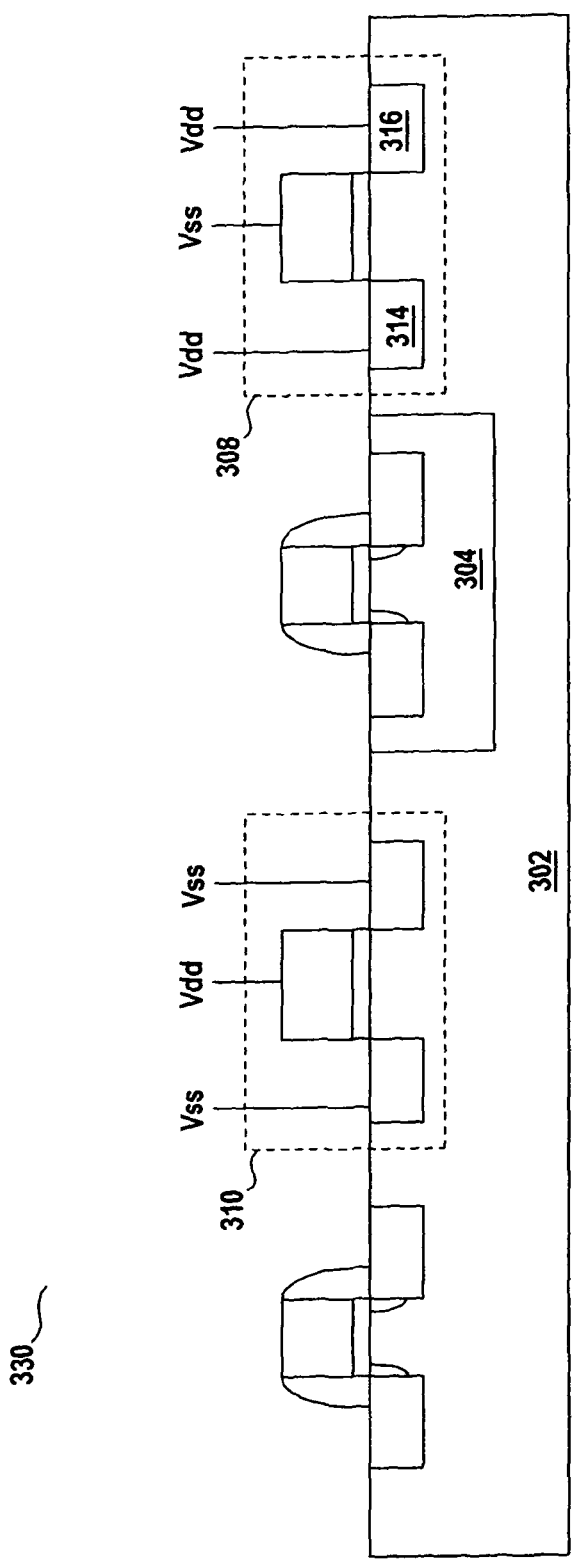
FIG. 3B presents a partial cross-sectional view of a CMOS device having a first guard ring built on a P-type semiconductor substrate with a PMOS capacitor configuration and a second guard ring built outside a N-well with a NMOS capacitor configuration in accordance with a fourth embodiment of the present invention.

FIG. 3B presents a partial cross-sectional view of a CMOS device 330 having a first guard ring built on a P-type semiconductor substrate with a PMOS capacitor configuration and a second guard ring built outside a N-well with a NMOS capacitor configuration in accordance with a fourth embodiment of the present invention. FIG. 3B is identical to FIG. 3A except that the guard ring 308 lies just outside the N-well 304. The guard ring 310 remains at the same relative location. The well contacts 314 and 316 have a lower hole collecting efficiency, but are virtually immune to debiasing. Without the N-well 304, the well contacts 314 and 316, which connect to Vdd, further help drive off the depletion region deeper into the P-substrate 302 to enhance the hole collecting efficiency.

This invention provides a novel method to reduce power noise and net voltage drop by fabricating a guard ring with a MOS capacitor configuration such that the capacitance can act as a noise filtering device and an ESD protection device. The primary advantage of this invention is that the guard ring may be constructed using the same fabrication techniques that are used to fabricate active devices that need to be protected by the guard ring. Specifically, a first guard ring made of P+ type material in a P substrate can be constructed next to an active device for capturing stray negative ions or electrons. A second guard ring constructed of N+ type material implanted in a physically thick N-well containing active devices is designed to capture stray holes. By using existing fabrication methods it is possible to construct a guard ring with a construction similar to that of a CMOS transistor. Such a guard ring is then wired to form a CMOS capacitor for providing capacitance for filtering noise.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A guard ring system in a semiconductor substrate for protecting an integrated circuit comprising:
    a first PMOS device formed within an N-well in the substrate, wherein the substrate is coupled to a first voltage;
    a first guard ring including a first NMOS device with its gate coupled to the first voltage and its source and drain coupled to a second voltage which is higher than the first voltage to form a first N+ guard ring and a second N+ guard ring, respectively,
    wherein the first NMOS device is formed within said N-well and is disposed adjacent to the first PMOS device;
    a second NMOS device formed outside the N-well; and
    a second guard ring formed between the first PMOS device and the second NMOS device, wherein the second guard ring is disposed outside the N-well and comprises a second PMOS device with its gate coupled to the second voltage and its source and drain coupled to the first voltage to form a first P+ guard ring and a second P+ guard ring, respectively.

2. The system of claim 1 wherein the first N+ and the second N+ guard rings are formed by implanting N-type material into the well.

3. The system of claim 1 wherein the first P+ and the second P+ guard rings are formed by implanting P-type material into the substrate.

4. The system of claim 1 wherein the gate of the first NMOS device comprises a first dielectric layer formed on the well and a first polysilicon layer formed on the first dielectric layer for applying the first voltage.

5. The system of claim 1 wherein the gate of the second PMOS device comprises a second dielectric layer formed on the substrate and a second polycrystalline layer formed on second the dielectric layer for applying the second supply voltage.

6. The system of claim 1 wherein the substrate is a P-type substrate.

7. A guard ring system in a semiconductor substrate for protecting an integrated circuit comprising:
    a PMOS device formed within an N-well in the substrate, wherein the substrate is coupled to a first voltage;
    a first guard ring including a first NMOS device with its gate coupled to the first voltage and its source and drain coupled to a second voltage which is higher than the first voltage to form a first N+ guard ring and a second N+ guard ring, respectively,
    wherein the first NMOS device is formed within said N-well and is disposed adjacent to the PMOS device;
    a second NMOS device formed in the substrate and disposed outside said N-well; and
    a second guard ring formed between the PMOS device and the second NMOS device, wherein the second guard ring comprises a P+ guard ring formed in the substrate and biased by the first voltage.

8. The system of claim 7 wherein the first N+ and the second N+ guard rings are formed by implanting N-type material into the well.

9. The system of claim 7 wherein the P+ guard ring is formed by implanting P-type material into the substrate.

10. The system of claim 7 wherein the gate of the first NMOS device comprises a first dielectric layer formed on the well and a first polysilicon layer formed on the first dielectric layer for applying the first voltage.

11. The system of claim 7 wherein the substrate is a P-type substrate.

* * * * *